United States Patent [19]

Kim

[11] Patent Number: 5,438,550
[45] Date of Patent: Aug. 1, 1995

[54] ADDRESS TRANSITION DETECTING CIRCUIT OF A SEMICONDUCTOR MEMORY DEVICE

[75] Inventor: Gyu S. Kim, Kyoungki-do, Rep. of Korea

[73] Assignee: Hyundai Electronics Industries Co. Ltd., Kyoungki, do, Rep. of Korea

[21] Appl. No.: 144,833

[22] Filed: Oct. 29, 1993

[30] Foreign Application Priority Data

Oct. 30, 1992 [KR] Rep. of Korea ............ 92-20144

[51] Int. Cl.$^6$ .................................................. G11C 8/00
[52] U.S. Cl. ..................... 365/233.5; 365/189.07; 365/194; 326/93; 327/143; 327/175; 327/227
[58] Field of Search .............. 365/233.5, 19, 189.07; 326/93; 327/143, 175, 227

[56] References Cited

U.S. PATENT DOCUMENTS

| | | | |
|---|---|---|---|
| 5,025,422 | 6/1991 | Moriwaki et al. | 365/233.5 |
| 5,124,584 | 6/1992 | McClure | 365/233.5 X |
| 5,159,574 | 10/1992 | Kim et al. | 365/233.5 |
| 5,264,737 | 11/1993 | Oikawa | 365/233.5 X |

*Primary Examiner*—Do Hyun Yoo
*Attorney, Agent, or Firm*—Morgan & Finnegan

[57] ABSTRACT

An ATD circuit of a semiconductor memory device includes a variable delay line for delaying an address signal, a logic comparator for comparing the logic of the address signal with that of the address signal delayed by the variable delay line to generate an ATD pulse signal having a constant width at the rising and falling edges of the address signal, and a power supply voltage detector for detecting a voltage level of the power supply voltage to adjust the length of the variable delay line according to the voltage level, so that the pulse width of the ATD pulse signal for controlling precharge and voltage equalization of a bit line and operation of a sense amplifier is constantly maintained independently of the variation of a power supply voltage to thus improve access speed of the semiconductor memory device.

7 Claims, 5 Drawing Sheets

Fig. 1 "Prior Art"

ADDRESS TRANSITION DETECTING CIRCUIT OF A SEMICONDUCTOR MEMORY DEVICE

BACKGROUND OF THE INVENTION

1. Field of the Invention

The present invention relates to an address transition detecting (hereinafter referred to as "ATD") circuit of a semiconductor memory device, and more particularly to an ATD circuit capable of generating an ATD pulse of a constant width independent of variation of a power supply voltage.

2. Background of the Prior Art

Semiconductor memory devices integrated on a semiconductor substrate such as static random access memories (SRAMs), dynamic random access memories (DRAMs) and nonvolatile memories utilize an ATD pulse signal to control the precharge and voltage equalization of a bit line, driving of a logic circuit in a sense amplifier, and driving of various logic circuits, The ATD pulse signal has a high or low logic of a predetermined width at a rising edge or falling edge of an address signal, and the pulse width of the ATD pulse signal must be properly set to allow the memory device to have a rapid access speed without causing malfunction. However, a conventional ATD circuit for generating the ATD pulse signal increases or decreases the pulse width of the ATD pulse signal according to the variation of a power supply voltage. Moreover, due to the pulse width of the ATD pulse signal decreased according to the excess power supply voltage over a normal operating voltage, the ATD pulse signal having an unnecessarily great pulse width is generated at the power supply voltage of a normal operating voltage level, thereby lengthening the access time of the memory device. This is because the conventional ATD circuit consists of logic circuits formed of MOS transistors which have a propagation delay time varied in accordance with the level of the power supply voltage. The ATD circuit of a conventional semiconductor memory device having the above-stated problems will be described with reference to FIG. 1.

Referring to FIG. 1, the ATD circuit of the conventional semiconductor memory device includes a first delay line 11 for delaying and inverting 1-bit address signal supplied into an input terminal 10, and a NOR gate 26 for receiving the address signal from the input terminal 10 and the inverted and delayed address signal from the first delay line 11. The NOR gate 26 compares the address signal with the inverted and delayed address signal to generate a pulse of a high logic whose pulse width is as much as the delay time of the first delay line 11 at the falling edge of the latter address signal. The ATD circuit further includes an inverter 18 for inverting the address signal from the input terminal 10, a second delay line 13 for inverting and delaying the inverted address signal from the inverter 18 to its original state and delaying it, and a NOR gate 28 for comparing the logic of the delayed address signal from the second delay line 13 with that of the inverted address signal from the inverter 18. The NOR gate 28 generates a pulse of a high logic whose width is as much as the delay time of the second delay line 13 at the rising edge of the address signal, and supplies the generated pulse of high logic to a third NOR gate 30. The third NOR gate 30 mixes the pulse from the second NOR gate 28 with that from the first NOR gate 26 and inverts the result, of the mixing, to generate an ATD pulse signal having a width as much as the delay time of the first and second delay lines 11 and 13 at the falling and rising edges of the address signal and output the ATD pulse signal via an output terminal 32. The first and second delay lines 11 and 13 include a series circuit consisting of three inverters 12~16 and 20~24, respectively, for fully securing the precharge period and voltage equalization period of a bit line in the semiconductor memory device. The inverters 12~16 and 20~24 are formed of MOS transistors (not shown) having shorter propagation delay time as the power supply voltage exceeds the normal operating voltage. Also, the first and second delay lines 11 and 13 have unnecessarily longer delay time at the normal operating voltage in order to fully secure the precharge period and voltage equalization period of the bit line in the semiconductor memory device at the power supply voltage which exceeds the normal operating voltage. In case that the power supply voltage maintains the normal operating voltage, the ATD pulse signal has an unnecessarily greater pulse width owing to the long delay times of the first and second delay lines 11 and 13.

As described above, to the ATD circuit of the conventional semiconductor memory device, in which the pulse width of the ATD pulse signal is determined by the delay time of the delay line, generates the ATD pulse signal having the unnecessarily greater pulse width at the normal operating voltage due to the delay lines formed of the MOS transistors, which have the propagation delay time decreased in accordance with the increased amount of the power supply voltage, to slow down the access speed of the semiconductor memory device,

SUMMARY OF THE INVENTION

Therefore, it is an object of the present invention to provide an address transition detecting circuit capable of accelerating access speed of a semiconductor memory device by generating an ATD pulse having a constant pulse width even though a power supply voltage is varied.

To achieve the above object of the present invention, an ATD circuit of a semiconductor memory device comprises a variable delay line for delaying an address signal, logical comparative means comparing the logic of an address signal and that of delayed address signal from the variable delay line to generate an ATD pulse signal with a predetermined width at rising and falling edges of the address signal, and power supply voltage detecting means for detecting voltage level of power supply voltage to adjust the length of the variable delay line according to the detected voltage level.

BRIEF DESCRIPTION OF THE DRAWINGS

The above objects and other advantages of the present invention will become more apparent by describing in detail a preferred embodiment thereof with reference to the attached drawings in which.

DETAILED DESCRIPTION OF THE PREFERRED EMBODIMENT

Figure 2:
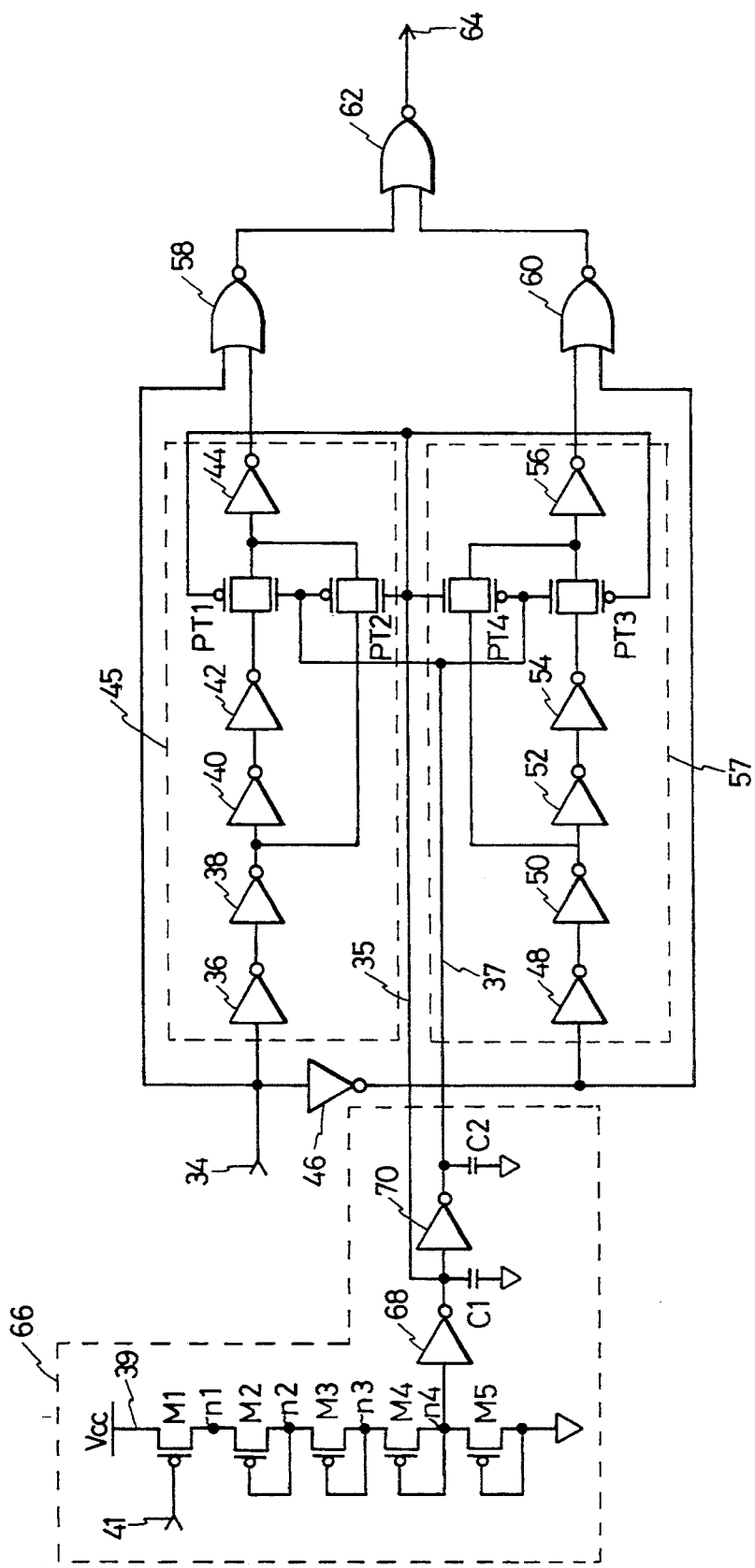
FIG. 2 is a circuit diagram showing an ATD circuit of a semiconductor memory device according to the present invention.

Referring to FIG. 2, an embodiment of an ATD circuit of the semiconductor memory device according to the present invention includes an input terminal 34 for receiving 1-bit address signal, and a first variable delay line 45 which delays the address signal input to the input terminal 34 for a predetermined period and inverts the obtained result and then supplies the delayed and inverted address signal to a first NOR gate 58. The first variable delay line 45 is formed of first to fifth inverters 36~44 serially connected between the input terminal 34 and the first NOR gate 58 for delaying and inverting the address signal supplied to the input terminal 34, and a pair of field effect transistors (hereinafter referred to as a "first shifting transistor PT1") connected between the fourth inverter 42 and the fifth inverter 44 for functioning as a shifter. The variable delay line 45 further has a-second shifting transistor PT2 consisting of a pair of field effect transistors connected between the second inverter 38 and the fifth inverter 44 for functioning as a shifter. One field effect transistor between the two of the first and second shifting transistors PT1 and PT2 is a P-type and the other is an N-type. The first shifting transistor PT1 and the second shifting transistor PT2 are turned on to mutual complement according to a pair of control signals commonly supplied via first and second control lines 35 and 37. The second shifting transistor PT2 is turned on when a power supply voltage Vcc has a voltage level identical to that of a normal operating voltage (e.g., 5.5 V) to form a first normal delay line having first, second and fifth inverters 36, 38 and 44. The first normal delay line delays the address signal supplied to the input terminal 34 by as much as the propagation delay time of the first, second and fifth inverters 36, 38 and 44, which is decreased due to the power supply voltage having the voltage level identical to that of the normal operating voltage of 5.5 V, and inverts the result to supply the delayed and inverted address signal to the first NOR gate 58. The delay time of the first normal delay line is set by a designer to correspond to the precharge period and voltage equalization period of the bit line required in the semiconductor memory device. The first shifting transistor PT1 is turned on when the power supply voltage Vcc maintains a high voltage level exceeding the normal operating voltage to form a first compensating delay line having the first to fifth inverters 36~44. The first compensating delay line compensates for the propagation delay time of the third and fourth inverters 40 and 42 corresponding to the propagation delay time of the first, second and fifth inverters 36, 38 and 44 decreased due to the power supply voltage of the high voltage level exceeding .the normal operating voltage of 5.5 V, thereby allowing the ATD pulse signal at the power supply voltage Vcc exceeding the normal operating voltage to have the same pulse width at the normal operating voltage.

The second shifting transistor PT2 is turned on when the power supply voltage maintains the voltage level identical to that of the normal operating voltage (e,g., 5.5 V) to form the first normal delay line having the first, second and fifth inverters 36, 38 and 44. The P-type field effect transistor of the first shifting transistor PT1 and the N-type field effect transistor of the second shifting transistor PT2 are turned on to mutual complement in accordance with the logic state of the delay control signal supplied from the control line 35 to respective gates of them. The N-type field effect transistor of the first shifting transistor PT1 and the P-type field effect transistor of the second shifting transistor PT2 are turned on to mutual complement in accordance with the logic state of the inverted delay control signal supplied from the control line 37 to respective gates of them. The first NOR gate 58 compares the logic of the address signal from the input terminal 34 with that of the inverted and delayed address signal from the fifth inverter 44 to generate a pulse signal of a high logic having a constant pulse width as much as the delay time of the first variable delay line 45 at the falling edge of the address signal.

Also, the ATD circuit of the semiconductor memory device further includes a sixth inverter 46 for inverting the address signal supplied to the input terminal 34, and a second variable delay line 57 for delaying the address signal inverted by the sixth inverter 46 for a predetermined period and inverting the result to supply the delayed and inverted address signal to a second NOR gate 60. The second variable delay line 57 is formed of seventh to eleventh inverters 48~56 and third and fourth shifting transistors PT3 and PT4 having the same operation and function as the first to fifth inverters 36~44 and the first and second shifting transistors PT1 and PT2, respectively, which form the first variable delay line 45. Because the construction of the second variable delay line 57 is the same as the first variable delay line 45, the detailed description of the second variable delay line 57 will be omitted. The second variable delay line 57 delays the inverted address signal from the sixth inverter 46 for a predetermined period regardless of the variation of the power supply voltage, and again inverts the inverted and delayed address signal to supply this inverted address signal to the second NOR gate 60. The second NOR gate 60 compares the logic of the inverted address signal from the sixth inverter 46 with that of the delayed address signal from the second variable delay line 57 or NOR-gates them to generate a pulse signal of a high logic having a width corresponding to the delay time of the second variable delay line 57 at the rising edge of the address signal, and supplies the pulse signal to a third NOR gate 62. Then, the third NOR gate 62 mixes the pulse signals from the first and second NOR gates 58 and 60, and inverts the mixed pulse signal, and then thereby generates an ATD pulse signal. The ATD pulse signal has a pulse of a low logic having a width corresponding to the delay time of the first and second variable delay lines 45 and 57 at the falling and rising edges of the address signal. The ATD pulse signal generated from the third NOR gate 62 is supplied to a logic circuit (not shown) of a sense amplifier, and a precharge circuit (not shown) and voltage equalization circuit (not shown) of the bit line in the semiconductor memory device via an output terminal 64.

Figure 3:
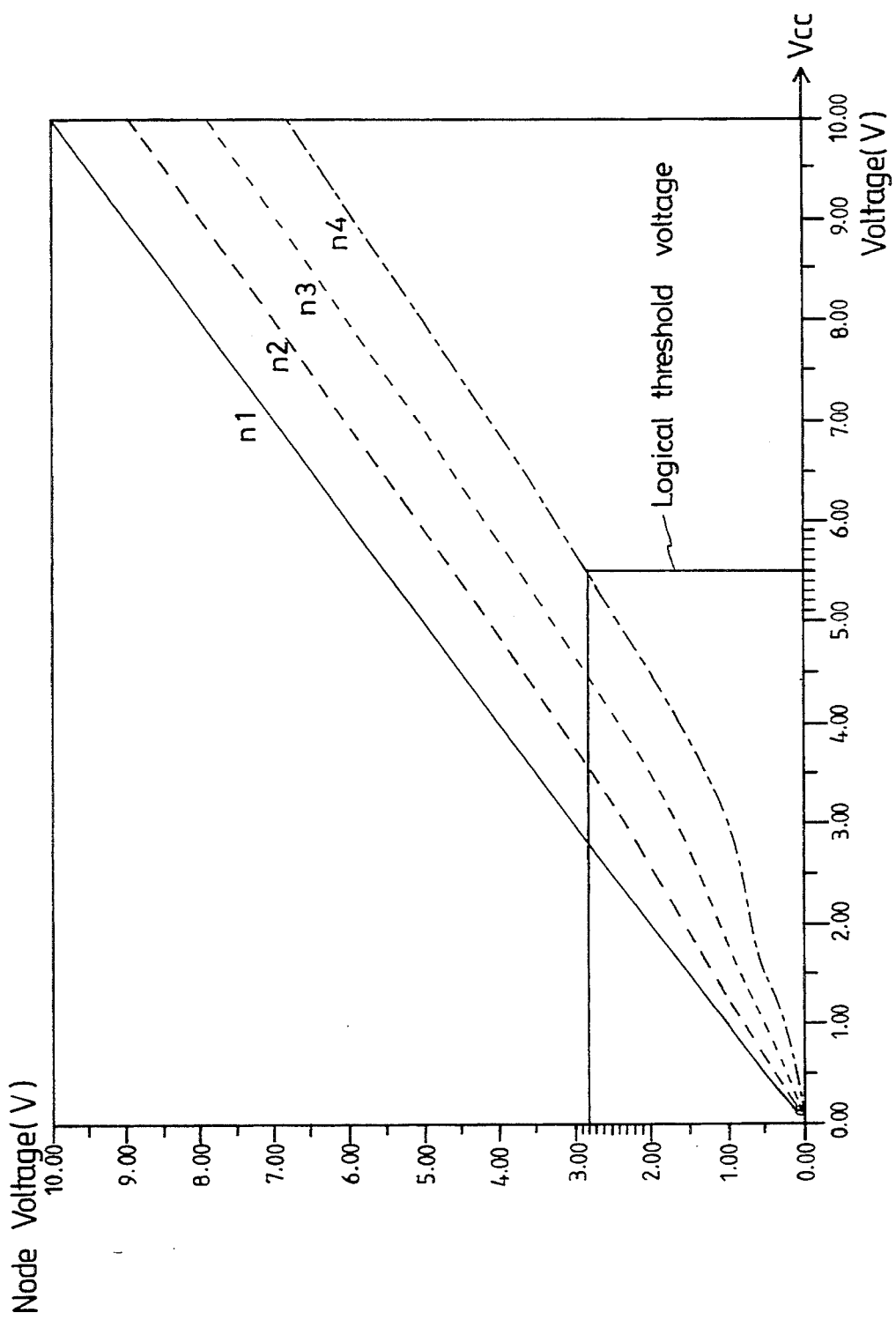
FIG. 3 is a graph representation plotting the variation of respective node voltages of a power supply voltage detector according to the variation of the power supply voltage.

Furthermore, the ATD circuit of the semiconductor memory device is provided with a power supply voltage detector 66 for detecting the voltage level of the power supply voltage Vcc supplied from an external power supply source (not shown) to a power supply line 39, and adjusting the length of the first and second variable delay lines 45 and 57 in response to the detected voltage level of the power supply voltage Vcc. The power supply voltage detector 66 includes five PMOS field effect transistors (hereinafter referred to as "transistors") M1~M5 serially connected between the power supply line 39 and ground GND to divide the power supply voltage by a predetermined ratio, and a twelfth inverter 68 generating a delay control signal by means of a logical operation of the voltage divided by the five transistors M1~M5. The first transistor M1 is turned on by a chip selection signal/CS of a low logic supplied to its own gate via a second input terminal 41 to function as a voltage divider together with the second to fifth transistors M2~M5. The gates of the second to fifth transistors M2~M5 are respectively connected to the sources of the second to fifth transistors M2~M5 to make the second to fifth transistors M2~M5 function as resistors each having the same resistance. For example, while the first to fourth transistors M1~M4 are set to have a wide channel width and short channel length, on the other hand, the fifth transistor M5 is set to have a narrow channel width and long channel length. In these circumstances, as represented in FIG. 3, node voltages at a node n1 between the first and second transistors M1 and M2, a node n2 between the second and third transistors M2 and M3, a node n3 between the third and fourth transistors M3 and M4 and a node n4 between the fourth and fifth transistors M4 and M5 are almost linearly increased along with the increase of the power supply voltage Vcc. Therefore, the designer properly adjusts the channel sizes of the first to fifth transistors Mi~M5 to set the divided voltage at the node n4 to be the same as a logical threshold voltage (e.g., 3.3 V) of the twelfth inverter 68 when the power supply voltage Vcc has the normal operating voltage level of 5.5 V which has been given as an example. The twelfth inverter 68 connected between the node n4 and the first control line 35 compares the divided voltage from the node n4 with its logical threshold voltage to generate a delay control signal having a high or low logic, and supplies the generated delay control signal to the gates of the P-type transistors in the first and third shifting transistors PT1 and PT3 and to the gates of the N-type transistors in the second and fourth shifting transistors PT2 and PT4, via the first control line 35. The delay control signal has a high logic in case that the divided voltage of the node n4 shown in FIG. 3 has a voltage level below 3.3 V (i.e., when the power supply voltage Vcc has a voltage level below 5.5 V); otherwise it has a low logic in case that the divided voltage of the node n4 has a voltage level of more than 3.3 V (i.e., when the power supply voltage Vcc has a voltage level of more than 5.5 V). A thirteenth inverter 70 connected between the first and second control lines 35 and 37 inverts the delay control signal from the twelfth inverter 68, and supplies the inverted delay control signal to the gates of the N-type transistors in the first and third shifting transistors PT1 and PT3 and to the gates of the P-type transistors in the second and fourth shifting transistors PT2 and PT4, via the second control line 37. In addition, a capacitor C1 connected between the first control line 35 and ground GND eliminates high-frequency noise of an impulse component included in the delay control signal subjected to the logical operation of the twelfth inverter 68. A capacitor C2 connected between the second control line 37 and the ground GND eliminates high-frequency noise of an impulse component included in the inverted delay control signal inverted by the thirteenth inverter 70.

Figure 1:
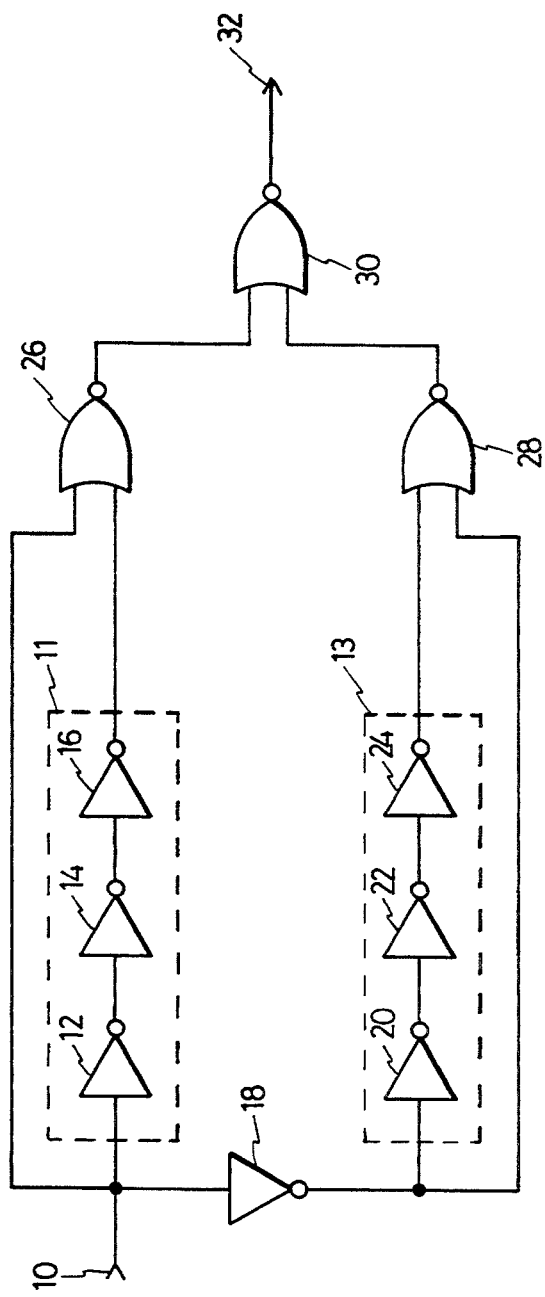
FIG. 1 is a circuit diagram showing an ATD circuit of a conventional semiconductor memory device.
Figure 4:
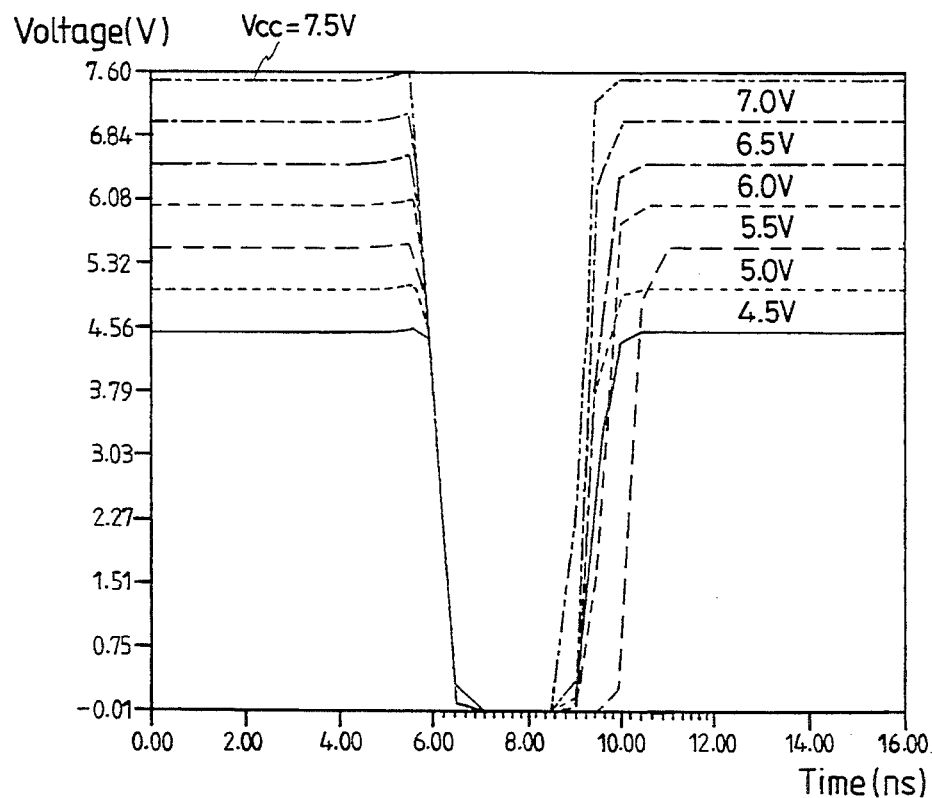
FIG. 4 is a graph representation plotting the change of the pulse width of the ATD pulse signal with respect to the varied power supply voltage of the ATD circuit of the semiconductor memory device according to the present invention, which is simulated by a SPICE program.
Figure 5:
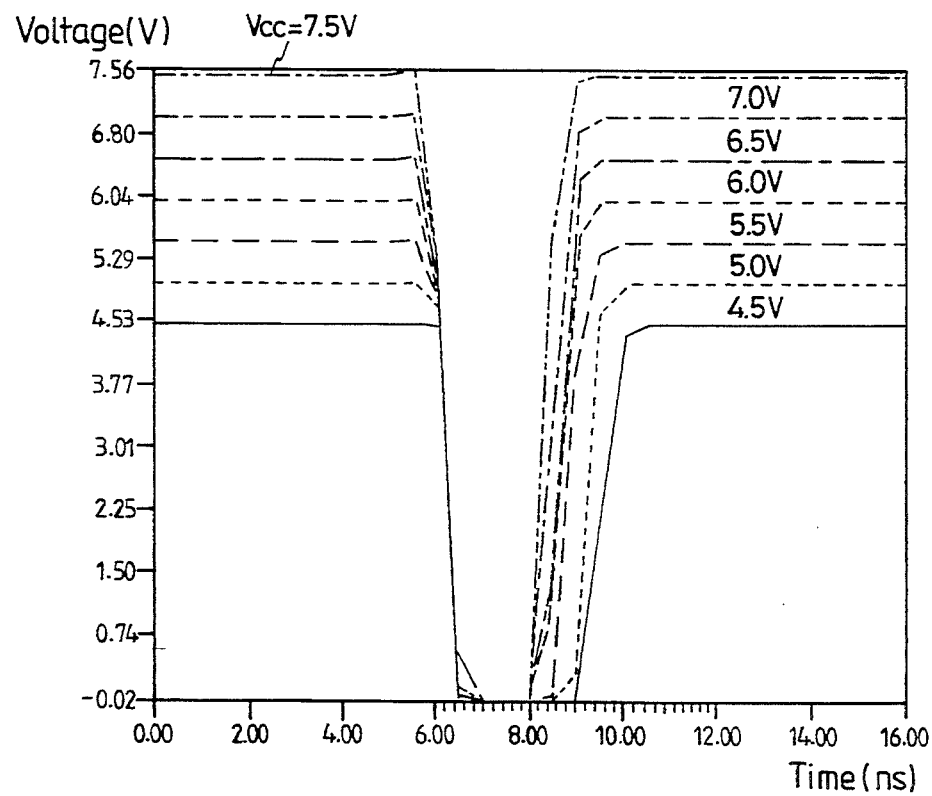
FIG. 5 is a graph representation plotting the change of the pulse width of the ATD pulse signal with respect to the varied power supply voltage of the ATD circuit of the conventional semiconductor memory device, which is simulated by the SPICE program.

FIG. 4 represents the result of a simulation by a SPICE program for plotting the change of the pulse width of the ATD pulse signal with respect to the variation of the power supply voltage Vcc generated by the ATD circuit of the semiconductor memory device according to the present invention. FIG. 5 represents the result of the simulation by the SPICE program for plotting the change of the pulse width of the ATD pulse signal with respect to the variation of the power supply voltage Vcc generated by the ATD circuit of the conventional semiconductor memory device shown in FIG. 1. As can be noted in comparing Figs. 4 with 5, the ATD circuit of the semiconductor memory device according to the present invention generates the ATD pulse signal having the pulse width greater than that of the ATD pulse signal generated in the ATD circuit of the conventional semiconductor memory device, especially when the power supply voltage Vcc has a high voltage level.

Figure 6:
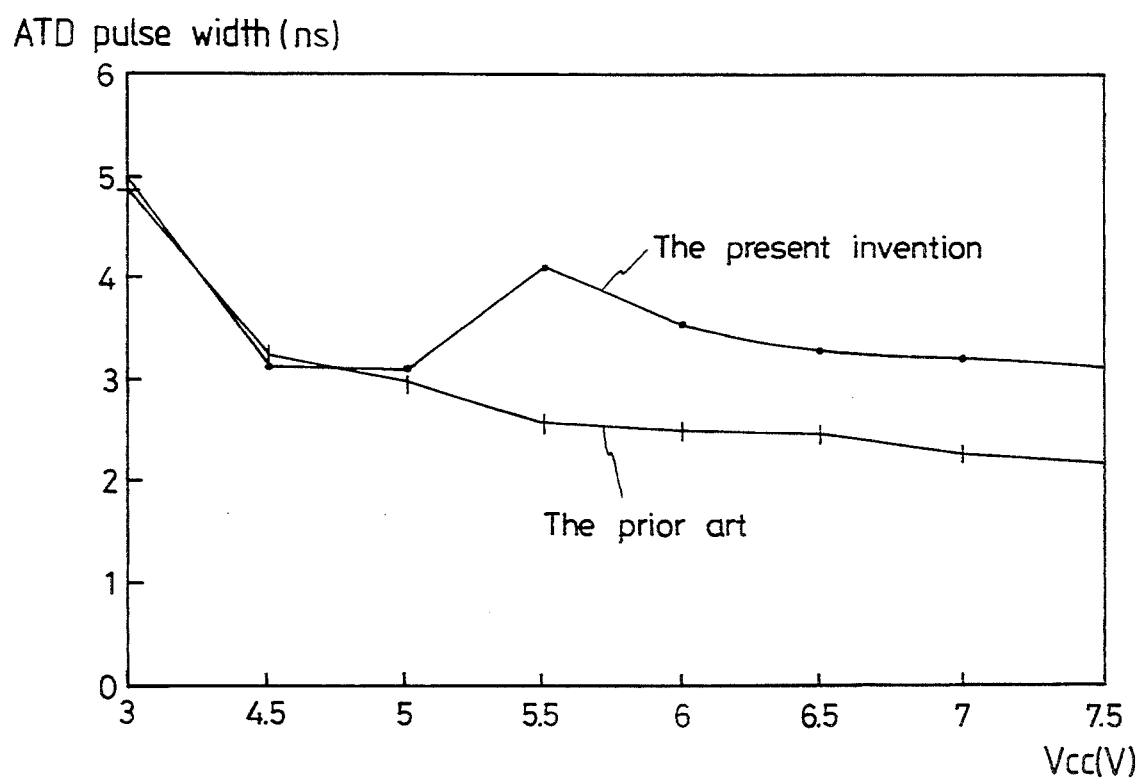
FIG. 6 is a graph representation comparing the results of the simulation shown in FIGS. 4 and 5.

FIG. 6 is a graph representing the pulse widths of the ATD pulse signals changed in response to the voltage level variation of the power supply voltage shown in FIGS. 4 and 5. The pulse period of the ATD pulse signal generated from the ATD circuit according to the present invention and that from the conventional ATD circuit shown in FIG. 6 in view of the voltage level of the power supply voltage are described in the following [Table 1].

TABLE 1

| external voltage (Vcc) | ATD pulse width of present invention | ATD pulse width of conventional technique |
|---|---|---|
| 3.0 V | 5.0 ns | 4.9 ns |
| 4.5 V | 3.2 ns | 3.3 ns |
| 5.0 V | 3.1 ns | 3.0 ns |
| 5.5 V | 4.1 ns | 2.6 ns |
| 6.0 V | 3.5 ns | 2.5 ns |
| 6.5 V | 3.3 ns | 2.5 ns |
| 7.0 V | 3.2 ns | 2.3 ns |
| 7.5 V | 3.1 ns | 2.1 ns |

As described above, the present invention can compensate for the delay time of the delay line, which is decreased along with the increase of the power supply voltage to generate the ATD pulse having a constant pulse width free from the variation of the power supply voltage. By this advantage, the size of the pulse width of the ATD pulse signal can be properly set at the normal operating voltage level to improve access speed of the semiconductor memory device.

While the present invention has been particularly shown and described with reference to a particular embodiment shown in FIG. 2, it will be understood by those skilled in the art that various changes in form and details may be effected in the circuit shown in FIG. 2 without departing from the spirit and scope of the invention. For example, in the ATD circuit shown in FIG. 2, the first NOR gate may be replaced with an exclusive-OR gate or exclusive-AND gate, and the sixth inverter, second variable delay line, and second and third NOR gates are eliminated to perform the present invention. Therefore, the spirit and scope of the present invention will be defined by the appended claims.

What is claimed is:

1. An address transition detecting circuit of a semiconductor memory device comprising:
   first input means for receiving an address signal;
   second input means for receiving a power supply voltage;
   a variable delay line for delaying said address signal from said first input means by a variable delay length that depends upon a delay control signal received by the variable delay line;
   logical comparative means for comparing the logic of said address signal from said first input means with that of the delayed address signal from said variable delay line to generate an address transition detecting pulse signal having a predetermined width at the rising and falling edges of said address signal; and
   power supply voltage detecting means for detecting the voltage level of said power supply voltage input to said second input means and generating said delay control signal according to the detected voltage level of the power supply voltage input.

2. An address transition detecting circuit of a semiconductor memory device as claimed in claim 1, wherein said variable delay line comprises:
   at least two delay means, each delay means having an output which provides the address signal delayed by a distinct delay time with respect to the address signal received at the first input means; and
   first switching means for selectively switching, according to said delay control signal, one of at least two delayed address signals from the output of one of one of said at least two delay means toward said logical comparative means.

3. An address transition detecting circuit of a semiconductor memory device as claimed in claim 2, wherein said power supply voltage detecting means comprises:
   voltage dividing means connected to said second input means for dividing said power supply voltage by a constant dividing ratio; and
   comparing means for comparing the divided voltage from said voltage dividing means with a reference voltage to generate a switching control signal having different logic values in accordance with the voltage level of said power supply voltage, and supply said switching control signal to said first switching means.

4. An address transition detecting circuit of a semiconductor memory device as claimed in claim 3, wherein said comparing means comprises at least one logic gate having different logic threshold values for performing a logical operation of said divided voltage from said voltage dividing means.

5. An address transition detecting circuit of a semiconductor memory device as claimed in claim 3, wherein said voltage dividing means comprises a level shifter formed of at least two MOS transistors.

6. An address transition detecting circuit of a semiconductor memory device as claimed in claim 1, wherein said power supply voltage detecting means includes:
   third input means for receiving a chip selection signal; and
   switching means being connected to said second input means for switching said power supply voltage by means of said chip selection signal from said third input means.

7. An address transition detecting circuit of a semiconductor memory device as claimed in claim 1, wherein said logical comparative means comprises an exclusive logic gate for generating a pulse of a predetermined logic when the logic of said address signal from said first input means is different from that of said delayed address signal from said variable delay line.

* * * * *